(12) United States Patent
Mäkipää et al.

(10) Patent No.: US 9,774,329 B2
(45) Date of Patent: Sep. 26, 2017

(54) PREVENTING TIMING VIOLATIONS (71) Applicants: Aalto University Foundation, Espoo (FI); Teknologian tutkimuskeskus VTT, Espoo (FI)

(72) Inventors: Jani Mäkipää, Espoo (FI); Lauri Koskinen, Espoo (FI); Matthew Turnquist, Espoo (FI); Markus Hiienkari, Espoo (FI)

(73) Assignee: Minima Processor Oy, Oulu (FI)

( * ) Notice: Subject to any disclaimer, the term of this patent is extended or adjusted under 35 U.S.C. 154(b) by 0 days.

(21) Appl. No.: 15/026,583

(22) PCT Filed: Oct. 2, 2014

(86) PCT No.: PCT/EP2014/071134
§ 371 (c)(1),
(2) Date: Mar. 31, 2016

(87) PCT Pub. No.: WO2015/049328
PCT Pub. Date: Apr. 9, 2015

(65) Prior Publication Data
US 2016/0241241 A1    Aug. 18, 2016

(30) Foreign Application Priority Data
Oct. 2, 2013  (EP) ..................... 13187094

(51) Int. Cl.
*H03L 7/00* (2006.01)
*H03K 3/00* (2006.01)
(Continued)

(52) U.S. Cl.
CPC ......... *H03K 19/00369* (2013.01); *G06F 1/04* (2013.01); *H03K 5/06* (2013.01); *H03K 5/19* (2013.01)

(58) Field of Classification Search
CPC .. H03K 19/003; H03K 19/00369; H03K 5/19; H03K 5/06; G06F 11/0757; G06F 11/0721; G06F 1/12
(Continued)

(56) References Cited

U.S. PATENT DOCUMENTS

| 8,130,019 B1 | 3/2012 | Awad | |
| 2001/0056552 A1* | 12/2001 | Cook | .................... G06F 9/3869 713/500 |
| 2012/0206166 A1* | 8/2012 | Potvin | .................. H03K 3/0375 327/18 |

OTHER PUBLICATIONS

Kwanyeob Chae et al: "Timing error prevention using elastic clocking". IC Design&Technology (ICICDT), 2011 IEEE International Conference on. IEEE. May 2, 2011 ((May 2, 2011).

* cited by examiner

*Primary Examiner* — Thomas Skibinski
(74) *Attorney, Agent, or Firm* — TIPS Group (57) ABSTRACT

An apparatus, comprising a clock adapted to provide a clock signal alternating with a cycle between a first level and a second level if a timing violation is not detected; a first latch adapted to be clocked such that it passes a first signal when the clock signal is at the first level; a second combinational logic adapted to output a second signal based on the first signal passed through the first latch; a second latch adapted to be clocked such that it passes the second signal when the clock signal is at the second level; a detecting means adapted to detect the timing violation of at least one of the first signal and of the second signal; a time stretching means adapted to stretch, if the timing violation is detected, the clock such that the clock alternates between the first level and the second level with a delay.

14 Claims, 10 Drawing Sheets

(51) Int. Cl.
    *H03K 19/003*    (2006.01)
    *G06F 1/04*    (2006.01)
    *H03K 5/19*    (2006.01)
    *H03K 5/06*    (2006.01)

(58) Field of Classification Search
    USPC ..... 327/161, 291, 292, 261, 18, 202, 90, 94;
                326/93, 96, 10, 26; 716/108, 106, 110,
                                            716/111, 113
    See application file for complete search history.

PREVENTING TIMING VIOLATIONS

FIELD OF THE INVENTION

The present invention relates to an apparatus, a method, and a computer program product related to timing of a pipelined digital logic. More particularly, the invention provides a mechanism to avoid false timing violations and to mitigate timing violations.

BACKGROUND OF THE INVENTION

Abbreviations

CLK Clock
FW Firmware
HW Hardware
LL Logical Latch
SW Software
TB Time Borrowing
TED Timing Error Detection
TEP Timing Error Prevention In today's digital logic systems, it is tried to increase the operation frequency while at the same time reducing the power consumption. In such systems, timing violations (including timing errors) may occur due to e.g. (local) voltage drops, temperature variations, variations in gate lengths, doping concentration variations of transistors and other semiconductor elements, cross-coupling noise etc. Also, different manufacturing process global and local corners in different parts of a digital logic circuit may lead to timing violations. In order to avoid timing violations due to too slow combinational logics, typically timing margins are applied.

Figure 1:
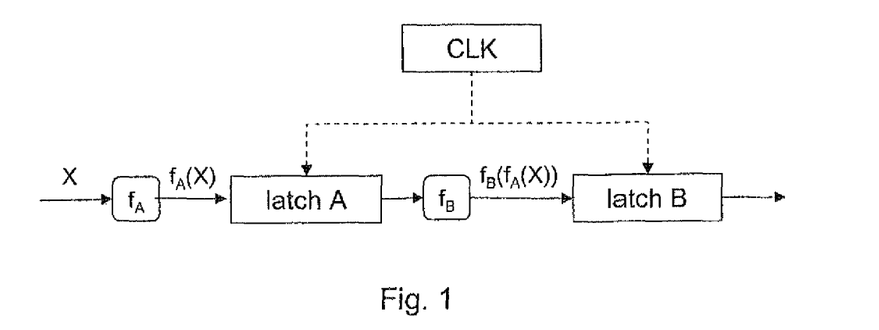

In the present application, as a timing violation, the following behavior is understood (see FIG. 1):

The digital logic (also named logic circuit) comprises one or more combinational logics such as $f_A$ and $f_B$ in FIG. 1. The result of the operation of the combinational logics is stored in a respective (1-bit) register such as register A, register B. The registers may be latches or flip-flops or a mixture of both of them. They work (are clocked or gated) according to a clock CLK. In the figures, dashed arrows indicate clocking. A flip-flop is transparent for data input at a (rising or falling) edge of the clock. A latch is transparent for data input if the clock has a predefined state (high or low). When the clock transits from this state to the other state, the actual data input is stored and maintained in the latch until the clock transits again to the predefined state. Hereinafter, latches are considered.

If the digital logic works correctly, combinational logic $f_A$ works on input signal X to obtain $f_A(X)$. If latch A is transparent for data input at a first cycle of the clock (at a certain level of the clock such as HIGH), it passes $f_A(X)$ while the clock remains on the certain level, and stores $f_A(X)$ when the clock transits into the opposite level (e.g. LOW). If there are subsequent combinational logics and latches, as e.g. $f_B$ and latch B shown in FIG. 1, combinational logic $f_B$ will operate on $f_A(X)$, obtaining $f_B(f_A(X))$. This result is stored in latch B at a second cycle of the clock when the latch B is transparent for data input (if the clock is again at the certain level).

However, if combinational logic A has not finished its operation when latch A becomes transparent for data input, latch A will store, when the clock transits into the opposite level, a value which might be different from $f_A(X)$. This is named a timing violation. If the output of register A is different from $f_A(X)$, the timing violation may result in a timing error. Accordingly, a subsequent combinational logic may work on a "wrong" input, such that it does not obtain $f_B(f_A(X))$.

Timing violations may be detected by TED. E.g., a following method of timing violation detection is known:

In parallel to a main latch such as latch A or latch B of the example above, a slow latch A' (or B') is implemented which is clocked with a fixed delay relative to the main latch A (or B). The output of combinational logic $f_A$ (or $f_B$) is fed into latch A' (or B'), too. The output of these two latches A and A' (or B and B') is compared after the data input time of latch A' (or B'). If the outputs are the same, there was no timing violation. However, if the input is changed during the fixed delay (because combinational logic $f_A$ or $f_B$ was too slow for latch A or latch B, respectively), the outputs of the two latches A and A' (or B and B') are different from each other. Hence, the comparison of the outputs shows that a timing violation occurred. In this case, the timing violation must not exceed the fixed delay.

Other known error detection methods which may be used to detect a timing error are e.g.

N+M redundancy (an argument could be made that TED is latch level N+M);
Information redundancy techniques (Hamming and Hsiao codes); and
Algorithmic techniques (parity check, cyclic redundancy check).

If a timing violation occurs, it may be corrected e.g. by a mechanism to re-execute, since some registers may have corrupted data due to the timing violations.

Another way to overcome timing violations for slow combinational logics is time borrowing (TB). In time borrowing, e.g. described in K. Chae, C. H. Lee, and S. Mukhopadhyay, "Timing error prevention using elastic clocking", IEEE, 978-1-4244-9021-9 (2011), a cycle in which a timing violation is detected in one combinational logic (e.g. $f_A$) may borrow time from the subsequent cycle for the subsequent combinational logic (e.g. $f_B$). If combinational logic B is fast enough, the delay of its input is compensated and the timing violation is overcome.

However, if combinational logic B is not fast enough, the timing violation (the delay time of the signal) may propagate such that another timing violation may occur in the next state. The timing violations may even accumulate in subsequent cycles leading finally to a destructive error. In order to mitigate such accumulation, Chae et al also describe clock stretching. According to clock stretching, if a timing violation is detected, the same is mitigated by time borrowing, wherein additionally to time borrowing the clock is retarded. E.g., the clock cycle from which time is borrowed is extended by a positive phase shift such as $\pi/2$ or even $\pi$. Thus, the clock cycle from which time is borrowed regains time from the stretched clock. If the borrowing and stretching are appropriately matched to each other, accumulation may be avoided. Time stretching may be considered as slow logic stepping into the execution time window.

If a timing violation is detected at every cycle in this scenario, and each cycle is extended e.g. by a phase shift of $\pi/2$ (delay of 25%), the overall operation frequency of the system is reduced from $1/T$ to $1/(T+T/4)$, where T is the clock period, i.e. by 20%. If each cycle is extended e.g. by a phase shift of $\pi$ (delay of 50%), the overall operation frequency of the system is reduced from $1/T$ to $1/(T+T/2)$, i.e. by 33%.

P. N. Whatmough, S. Das, and D. M. Bull describe in "A low power 1 GHz Razor FIR Accelerator with time-borrow tracking pipeline and approximate error correction in 65 nm CMOS", IEEE International Solid-State Circuits Conference, pages 428-430 (2013), TB tracking. In TB tracking, it is tracked if a timing violation can be successfully resolved in the subsequent combinational logic in the subsequent clock cycle. If timing violations are not resolved in a subsequent step, the supply voltage is adapted accordingly. The circuit according to Whatmough et al. provides interpolation based approximate error correction. Therefore, continuous signals are required.

In any case, a correction of a timing violation may slow down the system, and needs additional logics (means power consumption and semiconductor area). Therefore, preferably, timing violations are prevented.

On the other hand, if combinational logic $f_B$ is too fast, another timing violation may occur at latch B, sometimes also named "false timing violation". This is shown in FIG. 2 for the logic circuit of FIG. 1.

The first line shows the clock signal CLK alternating between high and low. It is assumed that the latches are open when CLK is high. Combinational logic $f_A$ operates properly, i.e., a new state is adopted when the clock CLK is low, i.e. when latch A is closed (second line of FIG. 2). Accordingly, latch A passes $f_A(X)$ when CLK becomes high and stores $f_A(X)$, when CLK becomes low again (T21, third line of FIG. 2).

Figure 2:
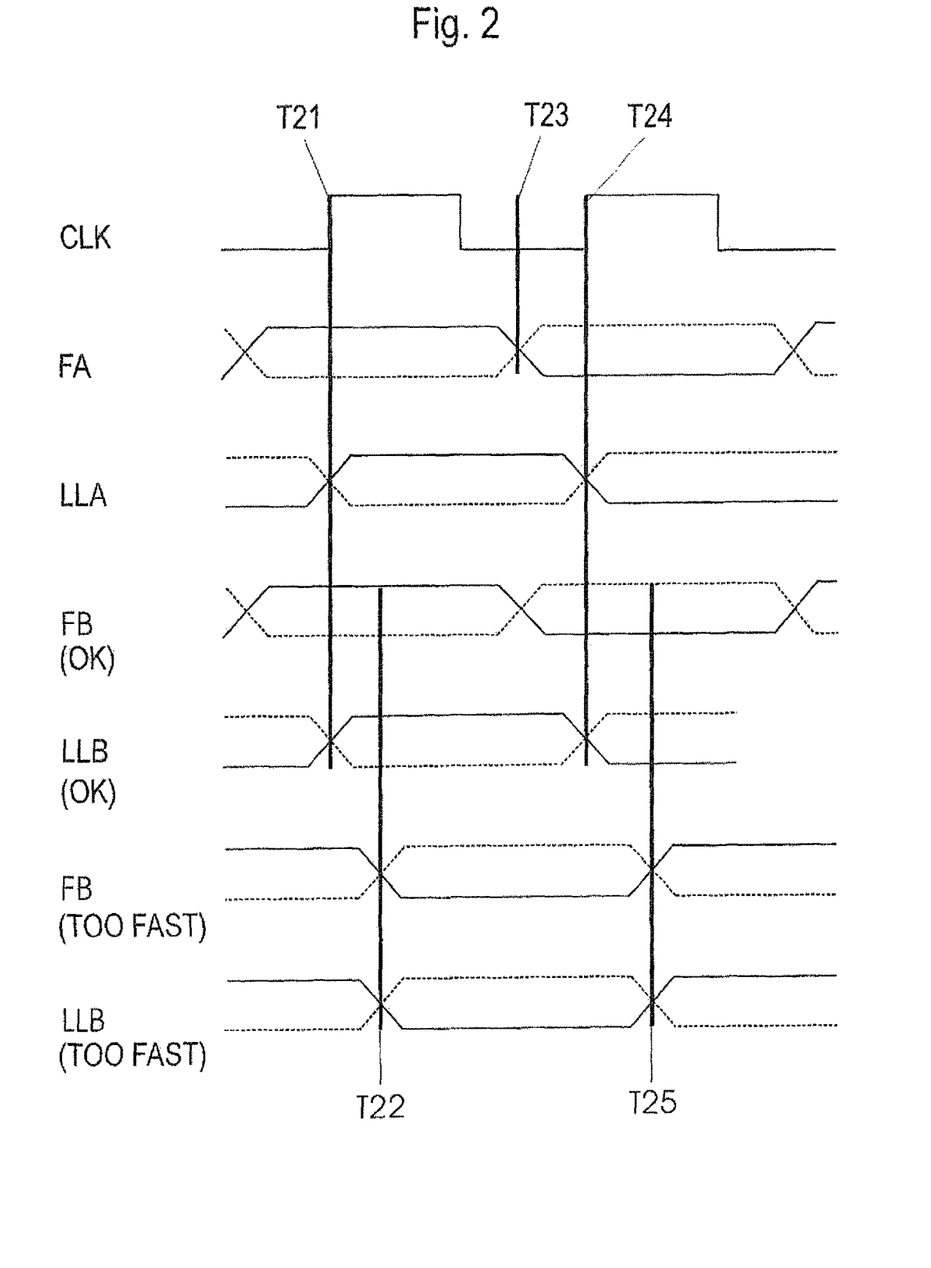
FIG. 2 shows a timing diagram of the logic circuit of FIG. 1.

In the fourth line of FIG. 2, proper operation of combinational logic $f_B$ is shown. I.e., combinational logic $f_B$ finishes its operation when CLK is low, as discussed hereinabove for $f_A$. This time may be the same or different from T23, where the output of $f_A$ changes its state. Accordingly, latch B stores $f_B(f_A(X))$ when CLK becomes high again (T24, fifth line of FIG. 2).

Now let's assume that combinational logic $f_B$ is too fast, i.e. that combinational logic $f_B$ has finished its operation on $f_A(X)$ while the clock is still in the high state where latch B is open for data input (T22, sixth line of FIG. 2). Hence, latch B is open and will pass $f_B(f_A(X))$ immediately after combinational logic B has finished its operation (at T22, i.e. during the first half-cycle of the clock) (seventh line of FIG. 2). Accordingly, if CLK transits into low at the end of the first cycle, latch B stores $f_B(f_A(X))$, although it should store (and output) $f_B(f_A(X-1))$ in the first signal, where X-1 is the input signal of the previous cycle.

As can be seen from FIG. 2, the content of latch B is different for the two cases of proper operation (line 5 of FIG. 2) and too fast operation (line 7 of FIG. 2) between the time where the too fast combinational logic $f_B$ has finished (T22) and the time where the CLK switches to high in the second cycle (T24). This may result in timing errors.

False timing violations cannot be detected by delayed latches as described hereinabove for timing violations. Therefore, logic circuits should be designed such that false timing violations do not occur. However, transition detection may be used to detect changes of a latch's input during its transparent phase.

Figure 3:
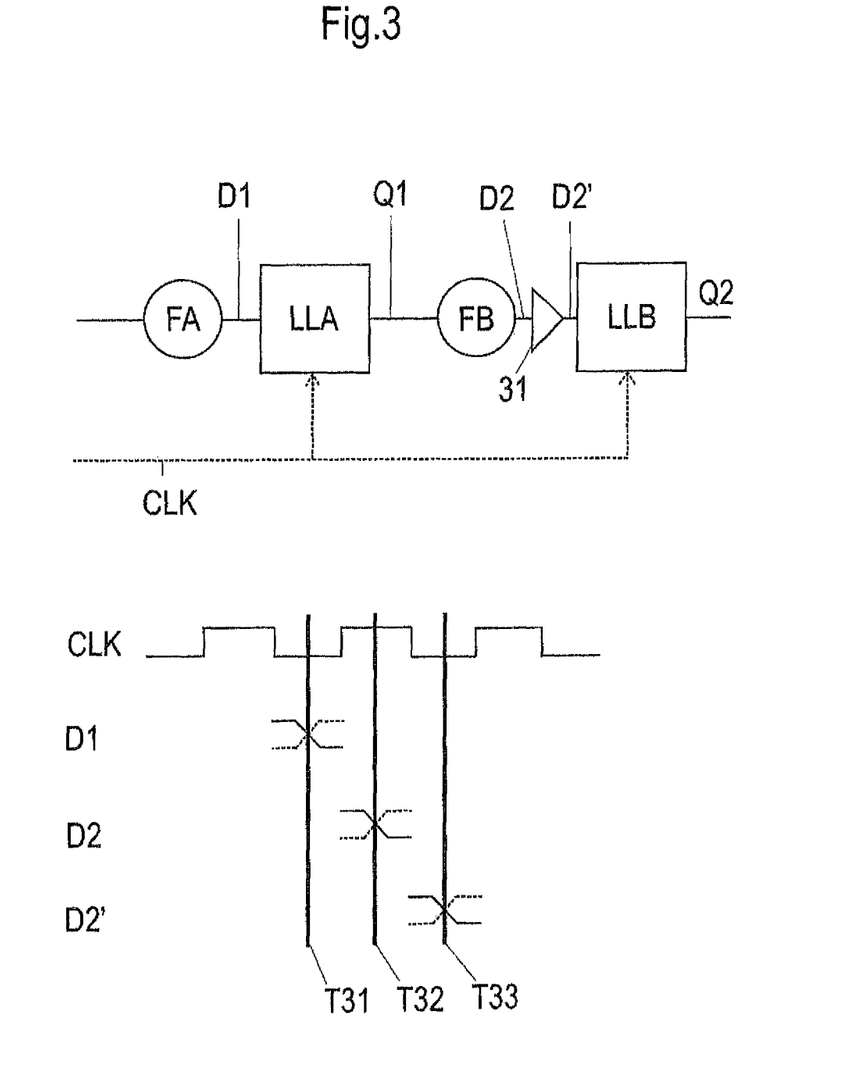
FIG. 3 shows a conventional logic circuit for mitigating false timing violations (top) and a timing diagram of the logic circuit (bottom)

False timing violations may be avoided using buffers. FIG. 3 shows an example, where a buffer 31 is provided between combinational logic $f_B$ and latch B. In the bottom part of FIG. 3, the corresponding signals are shown:

Combinational logic $f_A$ operates properly, i.e., the input to latch A (D1 in FIG. 3) changes at the low phase of the clock CLK, where latch A is closed (T31). On the other hand, combinational logic $f_B$ is too fast. Therefore, at its output D2, $f_B(f_A(X))$ appears while the latches A and B are still open (CLK: high, T32). The buffer 31 is inserted between the output D2 of the combinational logic $f_B$ and the input D2' of latch B. If the buffer 31 is appropriately dimensioned, D2' becomes $f_B(f_A(X))$ during the time latch B is closed (CLK: low; T33, see third line of bottom part of FIGS. 3). Q1 and Q2 designate the output of latches A and B, respectively.

Figure 4:
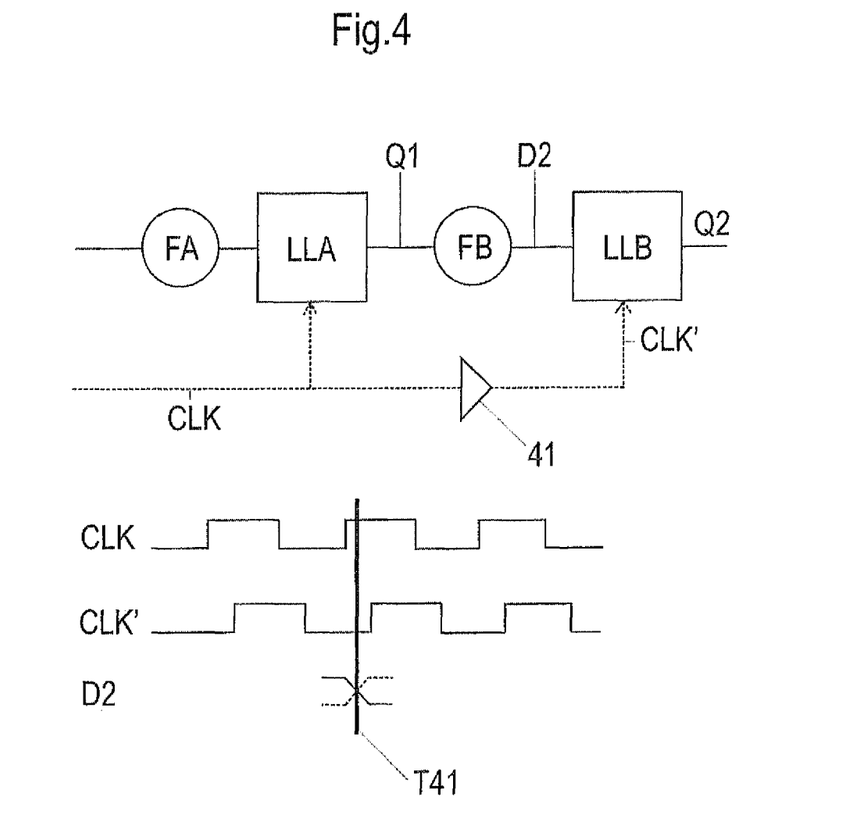
FIG. 4 shows a conventional logic circuit for mitigating false timing violations and a timing diagram of the logic circuit (bottom)

FIG. 4 shows another example for avoiding false timing violations. Instead of the buffer 31 inserted between combinational logic $f_B$ and latch B according to FIG. 3, a clock buffer 41 is inserted to delay the CLK signal for latch B. Hence, as may be seen at the bottom of FIG. 4, latch B is closed when the combinational logic $f_B$ has finished its operation at T41. Therefore, latch B will store $f_B$ only when CLK is high again.

In some examples, a buffer 31 of FIG. 3 and a clock buffer 41 of FIG. 4 are both present.

SUMMARY OF THE INVENTION

It is an object of the present invention to improve the prior art. In particular, it is an object to avoid false timing violations and to mitigate timing violations.

According to a first aspect of the invention, there is provided an apparatus, comprising a clock adapted to provide a clock signal, wherein the clock signal alternates with a cycle between a first level and a second level different from the first level if a timing violation is not detected; a first latch adapted to be clocked such that it passes a first signal when the clock signal is at the first level; a second combinational logic adapted to output a second signal based on the first signal passed through the first latch; a second latch adapted to be clocked such that it passes the second signal when the clock signal is at the second level; a detecting means adapted to detect the timing violation of at least one of the first signal at the first latch when the clock signal is at the first level and of the second signal at the second latch when the clock signal is at the second level; a time stretching means adapted to stretch, if the timing violation is detected, the clock such that the clock alternates between the first level and the second level with a delay compared to a time of alternating between the first level and the second level according to the cycle.

The detecting means may be a detecting circuit. The time stretching means may be a time stretching circuit.

Further details of the first aspect are defined in the appended apparatus claims.

According to a second aspect of the invention, there is provided a method, comprising passing a first signal through a first latch when a clock signal is at a first level; outputting a second signal based on the first signal passed through the first latch; passing the second signal through a second latch when the clock signal is at a second level; detecting a timing violation of at least one of the first signal at the first latch when the clock signal is at the first level and the second signal at the second latch when the clock is at the second level; stretching, if the timing violation is detected, the clock such that the clock alternates between the first level and the second level with a delay compared to a time of alternating between the first level and the second level according to a cycle; wherein the clock signal alternates with the cycle between the first level and the second level different from the first level if the timing violation is not detected.

The method of the second aspect may be a method of preventing timing violations.

According to a third aspect of the invention, there is provided a computer program product comprising a set of instructions which, when executed on an apparatus, is configured to cause the apparatus to carry out the method according to the second aspect. The computer program product may be embodied as a computer-readable medium.

According to some embodiments of the invention, at least one of the following advantages is achieved:
  false timing violations are avoided;
  system performance is improved;
  buffers are reduced or even eliminated;
  semiconductor area is saved;
  energy efficiency is improved;
  timing violations are efficiently mitigated.

It is to be understood that any of the above modifications can be applied singly or in combination to the respective aspects to which they refer, unless they are explicitly stated as excluding alternatives.

BRIEF DESCRIPTION OF THE DRAWINGS

Further details, features, objects, and advantages are apparent from the following detailed description of the preferred embodiments of the present invention which is to be taken in conjunction with the appended drawings, wherein FIG. 1 sketches an exemplary logic circuit.

DETAILED DESCRIPTION OF CERTAIN EMBODIMENTS

Herein below, certain embodiments of the present invention are described in detail with reference to the accompanying drawings, wherein the features of the embodiments can be freely combined with each other unless otherwise described. However, it is to be expressly understood that the description of certain embodiments is given for by way of example only, and that it is by no way intended to be understood as limiting the invention to the disclosed details.

Moreover, it is to be understood that the apparatus is configured to perform the corresponding method, although in some cases only the apparatus or only the method are described.

Figure 6A:
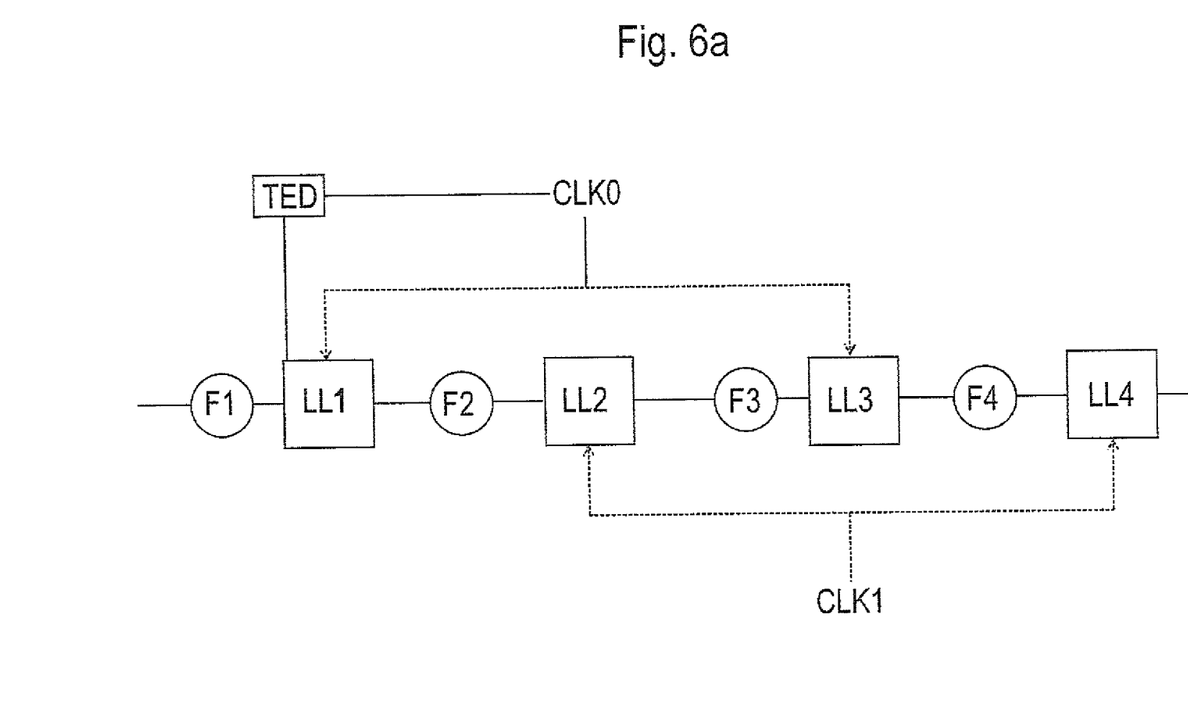
FIG. 6a shows an apparatus according to an embodiment of the invention.

FIG. 6a shows an embodiment of the invention. According to this embodiment, plural combinational logics F1, F2, . . . are sequentially arranged, wherein between two subsequent combinational logics, a latch LL1, LL2, . . . is arranged. Each combinational logic Fn (n=1, 2, . . . ) stores the result of its operation in the corresponding latch LLn (n=1, 2, . . . ). The subsequent combinational logic operates on the result stored in the latch arranged between the output of precedent combinational logic and its input.

In some embodiments, a buffer is not arranged between any of the combinational logics Fn and its corresponding latch LLn to which the combinational logic Fn stores its output. That is, each of the combinational logics is directly connected to its corresponding latch. However, in other embodiments, a respective buffer is arranged between at least one combinational logics and its corresponding latch.

The latches are clocked (gated). Each of the latches is open when the corresponding clock is in a predefined state (e.g. HIGH). Odd-numbered latches are clocked by CLK0, and even-numbered latches are clocked by CLK1. Hence, latches with inverse timings of their gatings are alternatingly arranged.

At least one of the latches LL1 to LL4 is connected to a timing error detection means TED. If it detects a timing error at the connected latch, it slows down the clocks CLK0 and CLK1 at least for the subsequent half-cycle (clock stretching). Otherwise, the clocks may not be stretched.

Figure 5:
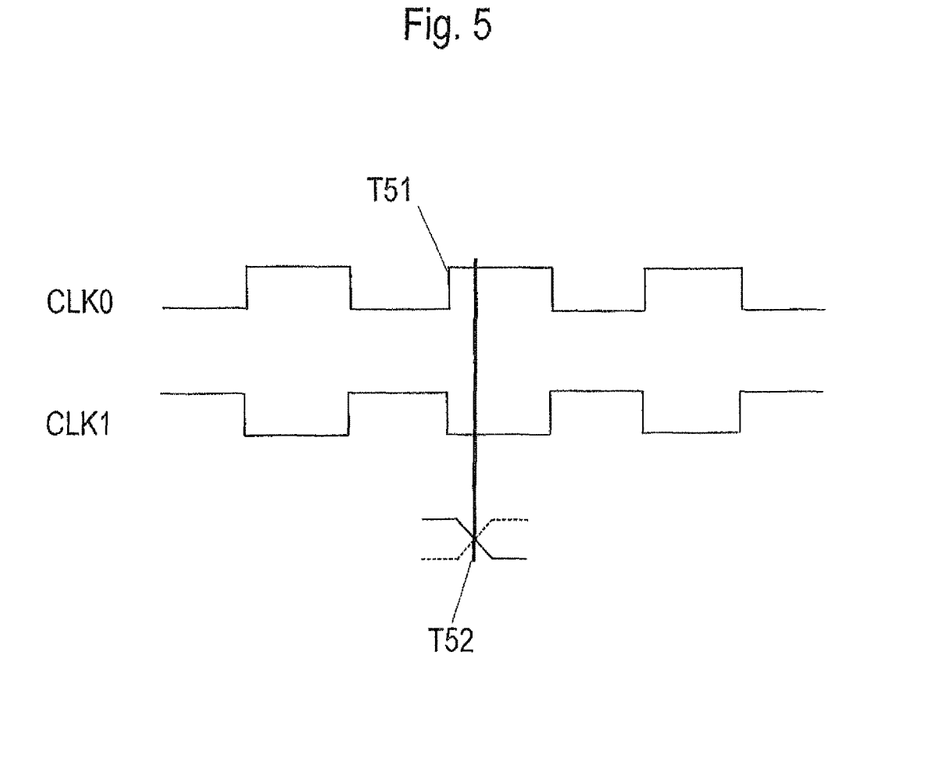
FIG. 5 shows a timing diagram of a clock used in some embodiments of the invention.

The signals of CLK0 and CLK1 used in an embodiment of the invention are shown in FIG. 5. CLK0 is inverse to CLK1. That is, each time when CLK0 is high, CLK1 is low, and each time when CLK0 is low, CLK1 is high. The duration of the high and/or low periods may depend on whether or not a timing error was detected.

Typically, clocks provide both the clock signal and the inverse clock signal. Hence, both CLK0 and CLK1 may be provided from the same clock. Alternatively, one clock signal (e.g. CLK1) may be generated from the other clock signal (e.g. CLK0) by inverting. However, the clock signals CLK0 and CLK1 may be provided by different clocks, too, if they are appropriately synchronized.

Figure 6B:
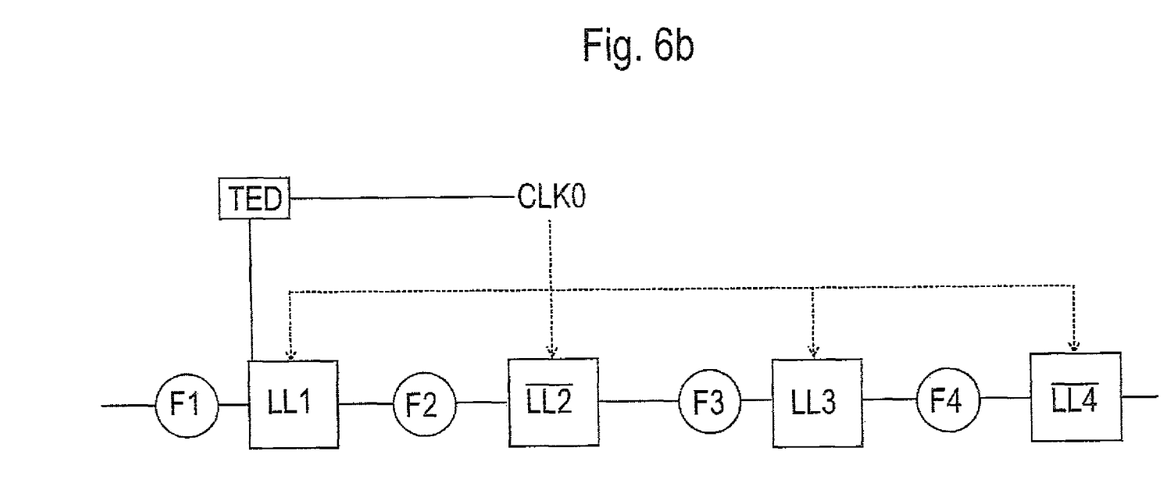
FIG. 6b shows an apparatus according to an embodiment of the invention.

FIG. 6b shows an alternative embodiment. Therein, all latches are clocked by the same clock signal (e.g. CLK). However, odd-numbered latches are open when CLK is in one state (e.g. high), and even-numbered latches are open when CLK is in the other state (e.g. low). Thus, the timings of the gatings of the clocks are alternatingly inverse, too. Otherwise, the logical circuit of FIG. 6b corresponds to that of FIG. 6a. In particular, at least one of the latches is connected to a timing error detecting means such that the clock may be stretched if a timing error is detected. In these embodiments, a wiring for the inverse clock signal is not required. On the other hand, odd-numbered latches are configured differently from even-numbered latches.

According to both of the embodiments of FIGS. 6a and 6b, the odd numbered latches are transparent when the even numbered latches are closed, and the odd numbered latches are closed when the even numbered latches are transparent. Thus, it is achieved that false timing violations cannot occur, as may be seen from the following:

Assume that combinational logic F2 is too fast, i.e., F2 provides its result while LL1 is still open. At that time, LL2 is closed. Hence, combinational logic F3 works on the result of F2 of the previous cycle. Then, LL1 is closed and stores the result of combinational F1, and LL2 opens, thus transmitting the result of F2 as an input to F3.

In the embodiments of FIGS. 6a, 6b, timing violations at any of the latches due to slow combinational logics are detected by TED and are mitigated by time stretching. Also, upon detection of a timing violation, other parameters like local temperature, supply voltage, bias voltage, clock frequency, and current may be adapted upon detection of a timing violation or if an average frequency of timing violations is outside a certain range. For example, a combination of TB, TED, and time stretching (also named Timing Error Prevention) may be applied to embodiments of the invention.

In the context of embodiments of the invention, a combinational logic is slow if it does not provide its result before its corresponding (subsequent) latch is opened (becomes transparent). If TED by a delayed latch is applied (as described hereinabove), it has to be clocked correspondingly to the main latch, with a phase delay less than n.

Embodiments of the invention may be favorably used in connection with time borrowing. Let's assume that combinational logic F1 is slightly too slow, i.e. does not provide its result while LL1 is closed but only after it has become transparent. On the other hand, if combinational logic F2 is too fast, as described in the previous paragraph, then, the total time required for F1 and F2 may be short enough such that the input of F3 (i.e. the output of LL2) is correct.

Figure 7A:
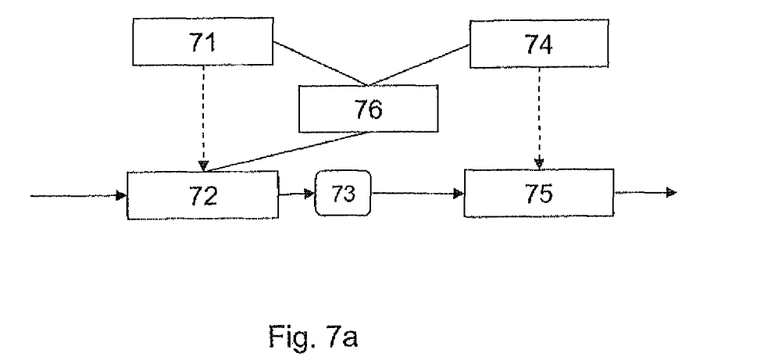
FIG. 7a shows an apparatus according to an embodiment of the invention.
Figure 8:
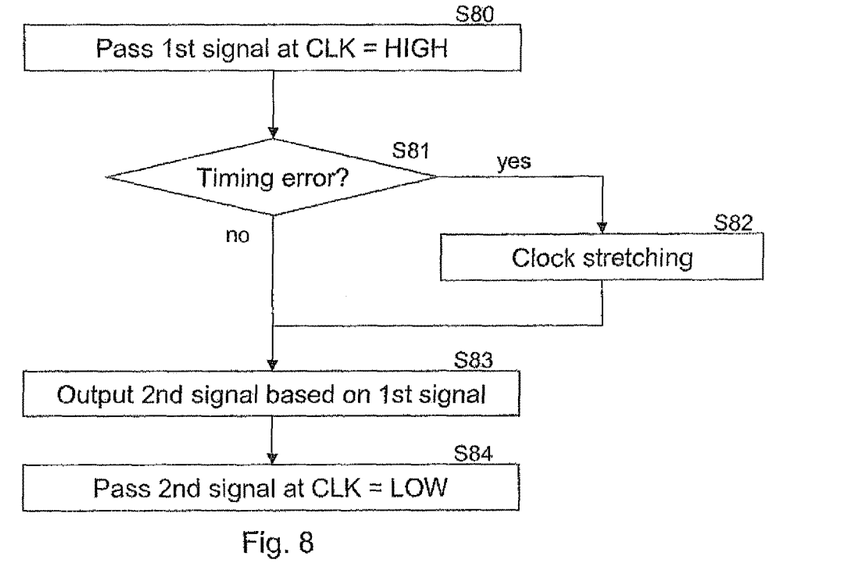
FIG. 8 shows a method according to an embodiment of the invention.

FIG. 7a shows an apparatus according to an embodiment of the invention. FIG. 8 shows a method according to an embodiment of the invention. The apparatus according to FIG. 7a may perform the method of FIG. 8 but is not limited to this method. The method of FIG. 8 may be performed by the apparatus of FIG. 7a but is not limited to being performed by this apparatus.

The apparatus comprises clock 71, latch 72, combinational logic 73, inverse clock 74, latch 75, and TED means 76. Latches 72 and 75 are of the same type (i.e. they are transparent if the corresponding clock is in one state (e.g. HIGH), and closed if the corresponding clock is in the other state (e.g. LOW)).

Latch 72 is clocked by clock 71, and latch 75 is clocked by clock 74. Each of the clocks alternates between respective two states (respective HIGH and LOW states). The timing of clock 71 with respect to latch 72 is inverse to the timing of inverse clock 74 with respect to latch 75. I.e., if latch 72 is open to pass data, latch 75 is closed, and if latch 72 is closed, latch 75 is open to pass data. For example, clock 71 and clock 74 may correspond to clock signal output and inverse clock signal output of the same clock if the latches 72 and 75 are of the same type.

At latch 72, it is detected by TED means 76 if a timing violation occurs. For example, TED means 76 may comprise a "slow latch" (i.e. clocked with a fixed delay relative to latch 72) in parallel to latch 72 and a comparison means to compare the content of the slow latch with that of latch 72, as described in the prior art section. If so, TED means 76 stretches clocks 71 and 74, e.g. by a phase shift such as π or π/2. Thus, the timing violation of a first combinational logic inputting its result into latch 72 may be leveled off at the next combinational logic 73.

Figure 7B:
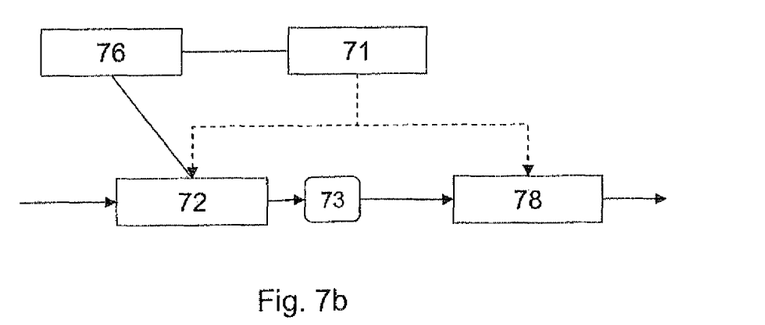
FIG. 7b shows an apparatus according to an embodiment of the invention.

FIG. 7b shows another apparatus according to an embodiment of the invention. The apparatus according to FIG. 7b may perform the method of FIG. 8 but is not limited to this method. The method of FIG. 8 may be performed by the apparatus of FIG. 7b but is not limited to being performed by this apparatus.

The apparatus comprises clock 71, latch 72, combinational logic 73, latch 78, and TED means 76.

The apparatus of FIG. 7b corresponds to that of FIG. 7a with the following differences: both latches 72 and 78 are clocked by the same clock 71. Accordingly, TED means 76 stretches only this one clock if it detects a timing violation at latch 72. On the other hand, latches 72 and 78 are of inverse types: If the clock 71 is in one state (e.g. HIGH) latch 72 is transparent and latch 78 is closed, and if the clock 71 is in the other state (e.g. LOW) latch 72 is closed and latch 78 is transparent.

The operations of the two embodiments of FIGS. 7a and 7b correspond to each other, and hence it is described jointly, also with respect to the method of FIG. 8.

Latch 72 passes an input signal (first signal, e.g. $f_A(x)$) if clock 71 is at a predefined level (e.g. HIGH), and stores it when the clock transits to the other level (e.g. LOW) (S80). At that time, latch 75 (78) is closed for signal input.

If a timing violation is detected (S81: yes) at latch 72, the clock is stretched (S82) at least for the next half-cycle, e.g. by a positive phase shift. Otherwise (S81: no), the clock may not be stretched.

Combinational logic 73 works on the signal provided by latch 72 (i.e. passed through or stored in latch 72) and provides an output signal (second signal, e.g. $f_B(f_A(X))$) (S83). Preferably, combinational logic 73 finishes its operation before latch 75 (78) is opened, otherwise, in some embodiments, a timing violation will be detected.

Combinational logic 73 may comprise any kind of a logical unit such as an AND gate, a NAND gate, an OR gate, a NOR gate, a logic inverter, an adder, a half-adder, etc. The combinational logic may have one or more input terminals and one or more output terminal(s), whereof one of the output terminal(s) is connected to the latch 75 (78).

When latch 75 (78) is open for signal input because clock 74 is in the corresponding state, latch 75 (78) passes the output signal of the combinational logic (S84) and stores it when clock 74 transits into the other state. During this time, latch 72 is closed for signal input.

In some embodiments, alternatively or in addition to TED means 76, a corresponding TED means for detecting a timing violation and stretching the clock(s) if the timing violation is detected may be applied to latch 75 (78).

Examples and embodiments are described under the assumption that the latches are open when the respective gating signal is high or low, respectively. However, in some embodiments, the high and low signals may be interchanged.

If a combinational logic being too slow for the timing according to an embodiment of the invention is to be combined in a pipeline with a sufficiently fast combinational logic, one may, as a first option, slow down the clock such that the slow combinational logic is fast enough. However, this slows down the whole logic pipeline.

As a second option, one may split the slow combinational logic into parts with alternatingly gated latches in between. This is known as "retiming". E.g., if the combinational logic is split in half, theoretically, the time required for each half is half of that required for the full slow combinational logic.

As a third option, e.g. if retiming is not possible or not desired for some reason, one may consider the following:

The logic circuit according to embodiments of the invention may be embedded in a larger logic circuit building a logic pipeline, wherein at least one part of the logic pipeline works conventionally such that all latches of this part are open at the same time, while in the part comprising the embodiment of the invention, the timing of the gatings are alternating for subsequent latches.

Figure 9:
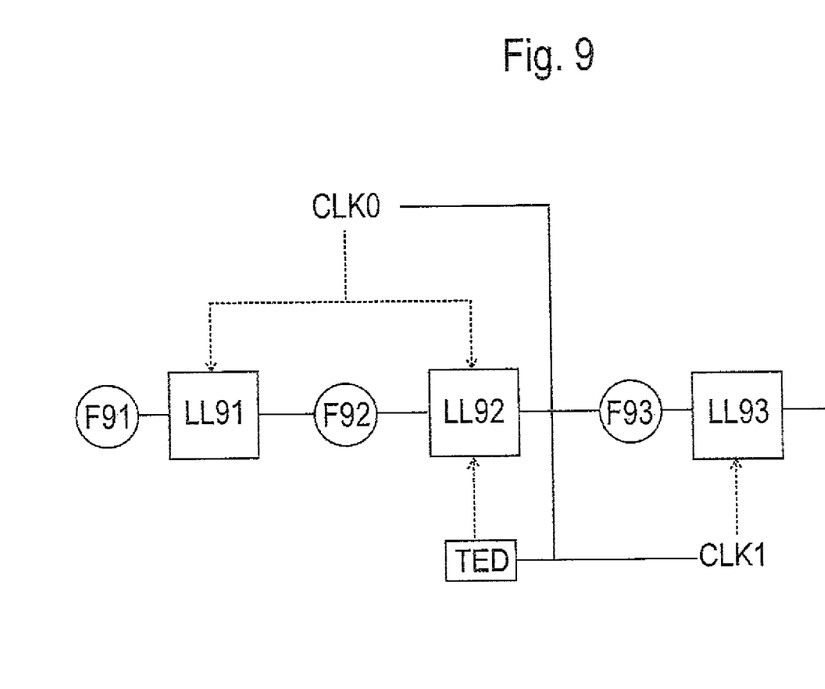
FIG. 9 shows a system according to an embodiment of the invention.

An embodiment is shown in FIG. 9 with latches of the same type and inverse clocks CLK0 and CLK1 (a corresponding embodiment may comprise latches of inverse types and a single clock, as discussed hereinabove).

Combinational logic F92 is embedded between latches LL91 (input to F92) and LL92 (output of F92) which have the same timings of their gatings. That is, LL91, F92, and LL92 are a conventional part of the logic pipeline.

On the other hand, latch LL93 where the result of combinational logic F93 is stored is inversely clocked to latch LL92 (input of F93). That is, LL92, F93, and LL93 are a part corresponding to an embodiment of the invention. Accordingly, timing error detection (and corresponding clock stretching, if necessary) is performed at least at LL92 but may be performed at some or all of the other latches, too.

Preferably, conventional parts comprise combinational logic(s) such as F92 with an appropriate processing time for conventional parts as discussed in the prior art section. That is, preferably, these combinational logics require more than half a cycle time and less than a full cycle time of the clock. Hence, these combinational logic(s) are too slow for the timing according to embodiments of the invention. On the other hand, combinational logics according to embodiments of the invention such as F93 preferably require less than half a cycle time of the clock. These combinational logic(s) are too fast for a conventional timing of the latches and may cause false timing violations if integrated in a conventional part.

The larger logic circuit may comprise one or more conventional parts and one or more embodiments of the invention. If there are plural conventional parts, the timings of the gatings in the different parts may be the same (i.e., all latches are open at CLK=high, for example), or the timing may be different in different parts (all latches in one conventional part are open at CLK=high, and all latches in another conventional part are open at CLK=low, for example), wherein a part comprising an embodiment of the invention is between conventional parts with different timings of the gatings. Hence, flexibility in design is enhanced because the number of latches in the part comprising the embodiment of the invention may be odd or even.

Each conventional part and each part comprising an embodiment of the invention comprises at least two latches. However, latches at the beginning and the end of a part may belong to a precedent or subsequent part, too (for example latch LL92 in FIG. 9).

Thus, relatively slow combinational logic may be combined with fast combinational logic in a pipeline without slowing down the clock.

Figure 10:
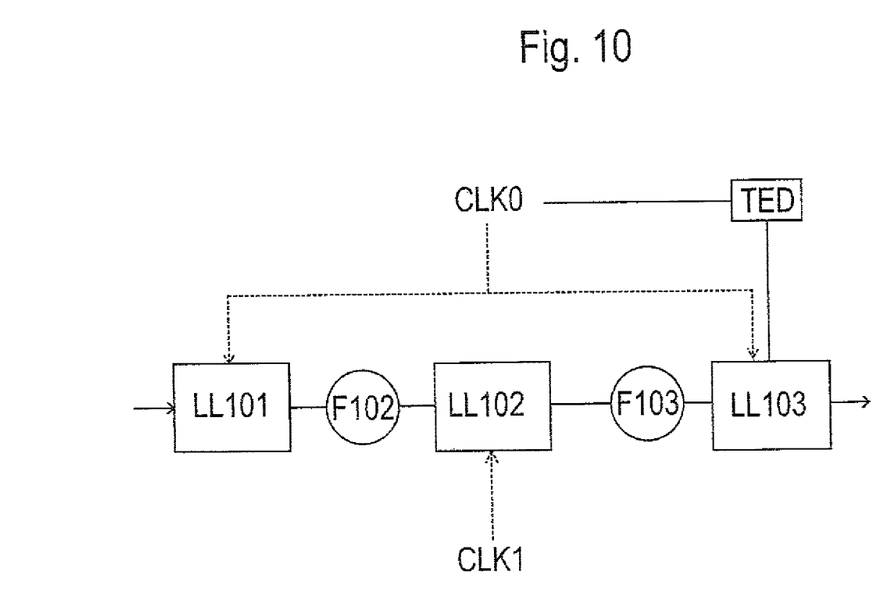
FIG. 10 shows a system according to an embodiment of the invention.

In some embodiments of the invention, a slow combinational logic may be combined with a fast combinational logic in the following way, as shown in FIG. 10:

F102 is a slow combinational logic to which an input signal from input latch LL101 is input. F102 outputs the result of its calculation into latch LL102. Since F102 is slow, timing errors may occur frequently at latch LL102. However, timing errors are not detected at latch LL102.

F103 is a fast combinational logic. It is that fast that false timing violations (because the calculation by the fast combinational logic takes less than half a cycle of the clock CLK0) would occur often at latch LL103, to which combinational logic F103 outputs its calculation result. However, latch LL103 is inversely clocked to latch LL102 (either because of inverse clocks CLK0, CLK1 if the latches LL102 and LL103 are of the same clocking type or because latches LL102 and LL103 are of inverse clocking types if they are connected to the same clock). Thus, as outlined above, a false timing violation cannot occur at latch LL103.

In this combination, slow combinational logic F102 may borrow time from fast combinational logic F103 such that timing violations do not (or hardly) occur at latch LL103. The remaining timing errors may be detected by TED of the signal at latch LL103 and clock stretching, as described hereinabove. Note that, although timing violations may occur mainly at latch LL102, they are not detected there but at latch LL103.

In this combination, semiconductor area and energy may be saved because timing error detection needs to be performed at the output latch of the fast combinational logic only.

The term "frequently" for the occurrence of timing violations at the slow combinational logic F102 means that, at a given nominal clock frequency and under specified operating conditions (such as voltage, temperature), timing violations with respect to a first sampling signal input into the slow combinational logic when its input latch LL101 becomes transparent occur with a probability of more than 50%, preferably more than 80%, more preferably more than 90%, and still more preferably more than 98%.

The term "often" for the occurrence of false timing violations at the fast combinational logic F103 means that, at the nominal clock frequency and under the specified operating conditions, false timing violations with respect to a second sampling signal input into the fast combinational logic when its input latch LL102 becomes transparent occur with a probability of more than 50%, preferably more than 80%, more preferably more than 90%, and still more preferably more than 98%.

Embodiments are described where the inverse clock signal is inverse to the clock signal. In the context of the present application, inverse is related to the timing of the clock. The amplitude of the inverse clock signal may be opposite to that of the clock signal (i.e. the respective high and low levels are the same) but need not to be opposite to that of the clock signal. E.g., one or both of the high and low levels of the inverse clock signal may be shifted by some bias voltage(s) relative to the corresponding level(s) of the clock signal. Also, e.g. one or both of the high and low levels of the inverse clock signal may be amplified (attenuated) by some factor(s) larger than 1 or less than 1 relative to the corresponding level(s) of the clock signal. In some embodiments, applying bias voltage and amplifying (attenuating) may be combined.

Each of the TED means described above is not restricted to a slow latch and a comparison means for timing error detection. In embodiments of the invention, any known method to detect timing violations or timing errors may be employed.

Each of the TED means described above may, in a case of two inverse clocks, be connected to both of the clocks to stretch them, or it may be connected to only one of the clocks if the inverse clocks are permanently synchronized.

The description of the arrangement of the latches and combinational logic(s) is related to their signal flow. The geometrical arrangement of the components may correspond to the signal flow but may also be different therefrom.

If not otherwise stated or otherwise made clear from the context, the statement that two entities are different means that they provide different functions. It does not necessarily mean that they are based on different hardware. That is, each of the entities described in the present description may be based on a different hardware, or some or all of the entities may be based on the same hardware.

Each of the clock(s), latches, and combinational logic(s) may be arranged on a separate substrate, or some or all of the components may be arranged on a same substrate.

Each of the clock(s), latches, and combinational logic(s) may be realized as hardware, software, firmware, or a mixture thereof. The software may be embodied as a computer-readable medium.

It is to be understood that what is described above is what is presently considered the preferred embodiments of the present invention. However, it should be noted that the description of the preferred embodiments is given by way of example only and that various modifications may be made without departing from the scope of the invention as defined by the appended claims.

The invention claimed is:

1. Apparatus, comprising
a clock adapted to provide a clock signal, wherein the clock signal alternates with a cycle between a first level and a second level different from the first level if a timing violation is not detected;
a first latch adapted to be clocked such that it passes a first signal when the clock signal is at the first level and is closed for the first signal when the clock is at the second level;
a second combinational logic adapted to output a second signal based on the first signal passed through the first latch;
a second latch adapted to be clocked such that it passes the second signal when the clock signal is at the second level and is closed for the second signal when the clock is at the first level;
wherein the first latch is adapted to be clocked such that the first latch is closed for the first signal when the clock is at the second level;
wherein the second latch is adapted to be clocked such that the second latch is closed for the second signal when the clock is at the first level;
wherein the first latch and the second latch are collectively clocked, and wherein the clock signal for the first and the second latches is synchronized;
a detecting means adapted to detect the timing violation of at least one of the first signal at the first latch when the clock signal is at the first level and of the second signal at the second latch when the clock signal is at the second level; and
a time stretching means adapted to stretch, if the timing violation is detected, the clock collectively for both the first latch and the second latch such that the clock alternates between the first level and the second level with a delay compared to a time of alternating between the first level and the second level according to the cycle.

2. The apparatus according to claim 1, further comprising
a first combinational logic adapted to output the first signal;
wherein the second combinational logic is adapted to output the second signal at a second output.

3. The apparatus according to claim 2, wherein
the second latch is directly connected to the second output;
the first combinational logic is adapted to output the first signal at a first output; and
the first latch is directly connected to the first output.

4. The apparatus according to claim 1, wherein
the clock is adapted to provide the clock signal and an inverse clock signal, wherein the inverse clock signal is at a first inverse level when the clock signal is at the first level, and the inverse clock signal is at a second inverse level different from the first inverse level when the clock signal is at the second level; and
the first latch is adapted to check if the clock signal is at the first level and to pass the first signal if the clock signal is at the first level, and the second latch is adapted to check if the inverse clock signal is at the second inverse level and to pass the second signal if the clock signal is at the second inverse level.

5. The apparatus according to claim 4, wherein
the first level is the same as the second inverse level; and
the second level is the same as the first inverse level.

6. The apparatus according to claim 4, wherein
the clock is adapted to output the clock signal at a clock output;
the first latch is directly connected to the clock output and adapted to check if the clock signal is at the first level and to pass the first signal if the clock signal is at the first level; and,
the clock is adapted to output the inverse clock signal at an inverse clock output, the second latch is directly connected to the inverse clock output, and the second latch is adapted to check if the inverse clock signal is at the second inverse level and to pass the second signal if the inverse clock signal is at the second inverse level.

7. The apparatus according to claim 1, wherein
the clock is adapted to output the clock signal at a clock output;
the first latch is directly connected to the clock output and adapted to check if the clock signal is at the first level and to pass the first signal if the clock signal is at the first level; and
the second latch is directly connected to the clock output, and the second latch is adapted to check if the clock signal is at the second level and to pass the second signal if the clock signal is at the second level.

8. The apparatus according to claim 1, comprising
plural combinational logics consisting of at least one odd-numbered combinational logic and at least one even-numbered combinational logic including the second combinational logic;
plural latches consisting of odd-numbered latches including the first latch and even-numbered latches including the second latch; wherein
each of the odd-numbered latches except for the first latch is adapted to pass a respective signal output from a corresponding one of the at least one odd-numbered combinational logic, and the first latch is adapted to pass the first signal;
each of the even-numbered latches is adapted to pass a respective signal output from a corresponding one of the at least one even-numbered combinational logic;
each of the at least one odd-numbered combinational logic is adapted to output the respective signal based on the signal passed through a directly precedent one of the even-numbered latches;
each of the at least one even-numbered combinational logic is adapted to output the respective signal based on the signal passed in a directly precedent one of the odd-numbered latches;
each of the odd-numbered latches is adapted to pass the respective signal output by the corresponding odd-numbered combinational logic when the clock signal is at the first level;
each of the even-numbered latches is adapted to pass the respective signal output by the corresponding even-numbered combinational logic when the clock signal is at the second level.

9. The apparatus according to claim 1, further comprising a third latch adapted to pass a third signal when the clock signal is at the first level;
a fourth combinational logic adapted to output a fourth signal based on the third signal passed through the third latch;

a fourth latch adapted to pass the fourth signal when the clock is at the second level; and a third combinational logic adapted to output the third signal based upon the second signal passed through the second latch.

10. Apparatus according to claim 1, wherein the first latch is adapted to store the first signal when the clock alternates from the first level to the second level and to maintain the first signal until the clock alternates again to the first level; and/or the second latch is adapted to store the second signal when the clock alternates from the second level to the first level and to maintain the second signal until the clock alternates again to the second level.

11. The apparatus according to claim 1, further comprising a third latch adapted to pass a third signal when the clock signal is at the first level;

a fourth combinational logic adapted to output a fourth signal based on the third signal passed through the third latch; and a fourth latch adapted to pass the fourth signal when the clock is at the first second;

wherein the first signal comprises the fourth signal passed through the fourth latch.

12. Apparatus, comprising a clock adapted to provide a clock signal, wherein the clock signal alternates with a cycle between a first level and a second level different from the first level if a timing violation is not detected;

a first latch adapted to be clocked such that it passes a first signal when the clock signal is at the first level and is closed for the first signal when the clock is at the second level;

a second combinational logic adapted to output a second signal based on the first signal passed through the first latch;

a second latch adapted to be clocked such that it passes the second signal when the clock signal is at the second level and is closed for the second signal when the clock is at the first level;

a detecting means adapted to detect the timing violation of at least one of the first signal at the first latch when the clock signal is at the first level and of the second signal at the second latch when the clock signal is at the second level;

a time stretching means adapted to stretch, if the timing violation is detected, the clock such that the clock alternates between the first level and the second level with a delay compared to a time of alternating between the first level and the second level according to the cycle;

a first combinational logic adapted to output the first signal, wherein the second combinational logic is adapted to output the second signal at a second output;

an input latch adapted to be clocked such that it passes an input signal when the clock is at the second level;

wherein the first combinational logic is adapted to output the first signal based on the input signal passed through the input latch;

wherein the detecting means is adapted to detect the timing violation of the second signal at the second latch when the clock is at the second level;

wherein the first latch is not operatively connected to a means for detecting the timing violation of the first signal at the first latch when the clock is at the first level;

wherein the first combinational logic is slow such that, if a first sampling signal is input into the first combinational logic if the clock alternates from the second level to the first level, the timing violation of the first signal based on the first sampling signal frequently occurs at the second latch; and wherein the second combinational logic is fast such that, if a second sampling signal is input into the second combinational logic if the clock alternates from the first level to the second level, the second combinational logic provides the second signal before the clock alternates to the first level with a probability of more than 50%.

13. Method, comprising passing a first signal through a first latch when a clock signal is at a first level;

closing the first latch for the first signal when the clock signal is at a second level;

outputting a second signal based on the first signal passed through the first latch;

passing the second signal through a second latch when the clock signal is at the second level;

closing the second latch for the second signal when the clock signal is at the first level;

clocking the first latch such that the first latch is closed for the first signal when the clock is at the second level;

clocking the second latch such that the second latch is closed for the second signal when the clock is at the first level;

wherein the first latch and the second latch are collectively clocked, and wherein the clock signal for the first and the second latches is synchronized;

detecting a timing violation of at least one of the first signal at the first latch when the clock signal is at the first level and the second signal at the second latch when the clock is at the second level; and stretching, if the timing violation is detected, the clock collectively for both the first latch and the second latch such that the clock alternates between the first level and the second level with a delay compared to a time of alternating between the first level and the second level according to a cycle;

wherein the clock signal alternates with the cycle between the first level and the second level different from the first level if the timing violation is not detected.

14. A computer program product comprising a set of instructions stored on a non-transitory computer-readable medium which, when executed on an apparatus, is configured to cause the apparatus to:

pass a first signal through a first latch when a clock signal is at a first level;

close the first latch for the first signal when the clock signal is at a second level;

output a second signal based on the first signal passed through the first latch;

pass the second signal through a second latch when the clock signal is at the second level;

close the second latch for the second signal when the clock signal is at the first level;

clock the first latch such that the first latch is closed for the first signal when the clock is at the second level;

clock the second latch such that the second latch is closed for the second signal when the clock is at the first level;

wherein the first latch and the second latch are collectively clocked, and wherein the clock signal for the first and the second latches is synchronized;

detect a timing violation of at least one of the first signal at the first latch when the clock signal is at the first level and the second signal at the second latch when the clock is at the second level; and stretch, if the timing violation is detected, the clock collectively for both the first latch and the second latch such that the clock alternates between the first level and the second level with a delay compared to a time of alternating between the first level and the second level according to a cycle;

wherein the clock signal alternates with the cycle between the first level and the second level different from the first level if the timing violation is not detected.

* * * * *